US010236808B2

(12) United States Patent
Murray et al.

(10) Patent No.: US 10,236,808 B2
(45) Date of Patent: Mar. 19, 2019

(54) SYSTEMS AND METHODS FOR DETERMINING MOTOR PARAMETERS

(71) Applicant: Analog Devices, Inc., Norwood, MA (US)

(72) Inventors: Brendan Aengus Murray, Los Angeles, CA (US); Jens Engen Sorensen, Carlsbad, CA (US)

(73) Assignee: Analog Devices, Inc., Norwood, MA (US)

( * ) Notice: Subject to any disclaimer, the term of this patent is extended or adjusted under 35 U.S.C. 154(b) by 77 days.

(21) Appl. No.: 15/247,635

(22) Filed: Aug. 25, 2016

(65) Prior Publication Data

US 2018/0062549 A1 Mar. 1, 2018

(51) Int. Cl.
*H02P 6/185* (2016.01)
*G01R 31/34* (2006.01)
*H02P 27/08* (2006.01)
*H02P 23/14* (2006.01)

(52) U.S. Cl.
CPC .......... *H02P 6/185* (2013.01); *G01R 31/34* (2013.01); *H02P 23/14* (2013.01); *H02P 27/08* (2013.01)

(58) Field of Classification Search
CPC .......... G01R 31/343; G01R 31/3624; G01R 31/3648; H02P 21/13; H02P 21/32; H02P 6/10; H02P 6/185; H02P 6/28
See application file for complete search history.

(56) References Cited

U.S. PATENT DOCUMENTS

| 4,772,839 | A | | 9/1988 | MacMinn et al. | |
|---|---|---|---|---|---|
| 5,663,618 | A | * | 9/1997 | Adachi | H02P 6/182 318/400.35 |
| 5,859,518 | A | * | 1/1999 | Vitunic | H02P 6/185 318/400.12 |
| 7,667,419 | B2 | * | 2/2010 | Fukamizu | H02P 6/182 318/400.01 |

(Continued)

OTHER PUBLICATIONS

Duan, Yu, et al., "A Novel Current Derivative Measurement Using Recursive Least Square Algorithms for Sensorless Control of Permanent Magnet Synchronous Machine", 2012 IEEE 7th International Power Electronics and Motion Control Conference, (Jun. 2012), 1193-1200.

(Continued)

*Primary Examiner* — Bentsu Ro
*Assistant Examiner* — Thai Dinh
(74) *Attorney, Agent, or Firm* — Schwegman Lundberg & Woessner, P.A.

(57) ABSTRACT

The present disclosure provides a system and method to determine at least one parameter of a motor, such as an inductance. The inductance can be determined, such as based on one or more digitally sampled motor winding currents. A digital filter can be applied to the digital samples such as to determine a slope of the motor winding currents. The digital filter can include a least squares fit that can be applied to the digital samples, such as to determine a slope of the motor winding currents. The least squares fit can be determined based on a computation of central tendencies such as an average value of time, an average value of current, an average value of the square of time, and the average value of the product of time and current. The average values can be determined recursively to provide improved computational speed.

21 Claims, 10 Drawing Sheets

(56) References Cited

U.S. PATENT DOCUMENTS

| | | | | |
|---|---|---|---|---|
| 7,723,946 B2 * | 5/2010 | Welchko | ............... | H02M 1/12 |
| | | | | 318/727 |
| 8,816,626 B2 * | 8/2014 | Kurosawa | ............... | H02P 6/182 |
| | | | | 318/504 |
| 9,059,651 B2 * | 6/2015 | Purfuerst | ............... | H02P 6/18 |
| 9,899,945 B2 * | 2/2018 | Jang | ............... | H02P 6/183 |
| 2012/0330595 A1 * | 12/2012 | Atay | ............... | G01P 3/46 |
| | | | | 702/96 |
| 2013/0082630 A1 * | 4/2013 | Purfuerst | ............... | H02P 6/18 |
| | | | | 318/400.32 |
| 2014/0156144 A1 * | 6/2014 | Hoshi | ............... | B62D 5/0463 |
| | | | | 701/41 |
| 2015/0365028 A1 * | 12/2015 | Hammel | ............... | H02P 6/18 |
| | | | | 318/400.32 |

OTHER PUBLICATIONS

Hind, David M., "Current derivative estimation for densorless motor drives", PhD thesis, University of Nottingham, (2015), 1-266.

Shaw, Steven R., "Numerical Methods for Identification of Induction Motor Parmeters", (Feb. 1997), 1-223.

\* cited by examiner

| VECTOR | $V_a$ | $V_b$ | $V_c$ |
|---|---|---|---|
| V100 | $V_{dc}$ | 0 | 0 |
| V101 | $V_{dc}$ | 0 | $V_{dc}$ |
| V001 | 0 | 0 | $V_{dc}$ |
| V011 | 0 | $V_{dc}$ | $V_{dc}$ |
| V010 | 0 | $V_{dc}$ | 0 |
| V110 | $V_{dc}$ | $V_{dc}$ | 0 |
| V000 | 0 | 0 | 0 |
| V111 | $V_{dc}$ | $V_{dc}$ | $V_{dc}$ |

$$L_d = V_{dc} \frac{\left(k_{ad}k_{cq} - k_{aq}k_{cd}\right)\Delta di_a^{V100}\Delta di_c^{V100} - \left(k_{ad}k_{bq} - k_{aq}k_{bd}\right)\Delta di_a^{V100}\Delta di_b^{V100} - \left(k_{bd}k_{cq} - k_{bq}k_{cd}\right)\Delta di_b^{V100}\Delta di_c^{V100}}{k_{cq}\Delta di_c^{V100} - k_{bq}\Delta di_b^{V100}}$$

$$L_q = \frac{L_d\left(k_{bd}\Delta di_b^{V100} - k_{cd}\Delta di_c^{V100}\right)}{\left(k_{cq}\Delta di_c^{V100} - k_{bq}\Delta di_b^{V100}\right)}$$

| V100 | V010 | V001 |
|---|---|---|
| $L_a = \dfrac{V_{dc} + L_b \cdot \Delta i b_b^{V100}}{\Delta i a_a^{V100}}$ $L_b = \dfrac{L_c \cdot \Delta i c_c^{V100}}{\Delta i b_b^{V100}}$ $L_c = \dfrac{-V_{dc} + L_a \Delta i a_a^{V100}}{\Delta i c_c^{V100}}$ | $L_a = \dfrac{-V_{dc} + L_b \Delta i b_b^{V010}}{\Delta i a_a^{V010}}$ $L_b = \dfrac{V_{dc} + L_c \cdot \Delta i c_c^{V010}}{\Delta i b_b^{V010}}$ $L_c = \dfrac{L_a \cdot \Delta i a_a^{V010}}{\Delta i c_c^{V010}}$ | $L_a = \dfrac{L_b \Delta i b_b^{V001}}{\Delta i a_a^{V001}}$ $L_b = \dfrac{-V_{dc} + L_c \cdot \Delta i c_c^{V001}}{\Delta i b_b^{V001}}$ $L_c = \dfrac{V_{dc} + L_a \cdot \Delta i a_a^{V001}}{\Delta i c_c^{V001}}$ |
| V110 | V101 | V011 |
| $L_a = \dfrac{L_b \Delta i b_b^{V110}}{\Delta i a_a^{V110}}$ $L_b = \dfrac{V_{dc} + L_c \cdot \Delta i c_c^{V110}}{\Delta i b_b^{V110}}$ $L_c = \dfrac{-V_{dc} + L_a \cdot \Delta i a_a^{V110}}{\Delta i c_c^{V110}}$ | $L_a = \dfrac{V_{dc} + L_b \Delta i b_b^{V101}}{\Delta i a_a^{V101}}$ $L_b = \dfrac{-V_{dc} + L_c \cdot \Delta i c_c^{V101}}{\Delta i b_b^{V101}}$ $L_c = \dfrac{L_a \cdot \Delta i a_a^{V101}}{\Delta i c_c^{V101}}$ | $L_a = \dfrac{-V_{dc} + L_b \Delta i b_b^{V011}}{\Delta i a_a^{V011}}$ $L_b = \dfrac{L_c \cdot \Delta i c_c^{V011}}{\Delta i b_b^{V011}}$ $L_c = \dfrac{V_{dc} + L_a \cdot \Delta i a_a^{V011}}{\Delta i c_c^{V011}}$ |

SYSTEMS AND METHODS FOR DETERMINING MOTOR PARAMETERS

FIELD OF THE DISCLOSURE

The present disclosure relates to systems and methods for determining one or more motor parameters such as the inductance in an AC motor such as to provide improved motor control.

BACKGROUND

AC motors are used in wide variety of industrial and consumer applications. A motor converts electrical energy into rotational mechanical energy. An alternating current (AC) motor can include motor windings located on a stationary stator and a rotor that includes current-carrying conductors, permanent magnets, or other means for producing a rotating magnetic field. During operation, alternating currents can be supplied to the motor windings to generate magnetic fields, which in turn can cause the rotor to rotate, such as for turning a motor shaft. In certain motor systems a current control loop can ensure proper operation of a motor, for example by ensuring that a phase current follows a reference. The tuning of parameters in the current control loop can be based on motor parameters such as inductance, resistance, or magnetization. However, since the motor parameters are often unknown, it is often not possible to optimize tuning of the current control loop.

SUMMARY OF THE DISCLOSURE

The present inventors have recognized, among other things, that there exists a need for a technique to quickly and accurately determine motor parameters such as to provide optimal tuning of a current control loop during operation of the motor. For example, a rise time, overshoot, or settling time can be optimized based on the determined motor parameters. Non-linear behavior of the motor can be compensated for based on the determined motor parameters. For example, the torque produced by the motor can be a non-linear function of the motor current because of saturation of the inductance of the motor. In such an example where the inductance is determined, the torque produced by the motor can be compensated to always have a linear relationship with the motor current. Such compensation for non-linear behavior can be important in automotive applications or hoist/crane applications. In certain systems, the current or voltage in the motor windings can be monitored and a fault condition can be triggered if the average value of current or voltage exceeds a threshold so that the motor can be de-energized to avoid unsafe conditions. In many systems, average values of voltage and current can be determined based on sampling once per pulse with modulation (PWM) period and are sufficient for protection. However, in high performance systems, a first derivative of current or voltage may be needed to improve performance. The slope of current in the motor winding currents can indicate when fault conditions exist, because usually, the inductance of the windings limits the slope of the winding current. If a winding is shorted, the inductance of the winding will decrease, thereby increasing slopes of currents and thereby indicating a fault condition. However, the slope of the winding current is prone to noise at high frequency and electrical noise from the power inverter can couple into the feedback path and contribute to errors. The slope of the winding current is, in the general case, not suitable for inductance estimation so alternative approaches that can be used can include AC signal injection, or separate current derivative sensors such as a Rogowski coils. The present inventors have recognized, among other things, that there is a need for an improved technique for determining the slope of current in motor windings and in determining one or more motor parameters such as inductance.

The present disclosure can provide, among other things, an improved technique of determining a motor parameter based on oversampling the current in the motor windings such as to provide optimal tuning of a current control loop during operation of the motor and overload protection.

In an aspect, the disclosure can feature a method for determining at least one motor parameter such as using an adaptive filter in a motor control system. The method can include sampling at least one phase current being supplied to at least one motor winding to form a set of sampled data points. The method can also include analyzing the set of sampled data points with a fitting function. The method can also include selecting at least one fitting window based on at least one phase voltage being switched on and off to the at least one motor winding. The at least one fitting window can be selected to exclude at least one transient component of the at least one phase current and including a subset of the sampled data points. The method can also include filtering the subset of sampled data points corresponding to the at least one fitting window, to determine at least one parameter of the fitting function. The method can also include determining the at least one motor parameter based on the determined at least one parameter of the fitting function. The fitting function can be a linear function. The at least one parameter of the fitting function can include a slope of the linear function. The at least one parameter of the fitting function can include an offset of the linear function. The method can also include determining the slope and offset of the linear function such as based on central tendencies respectively of phase current, time, the product of phase current and time, and the square of time, such as wherein the central tendencies are determined recursively. The method can also include determining the slope and offset of the linear function such as based on a square of a mean value of time, a mean value of a square of time, a product of a mean value of time and a mean value of phase current, and mean value of a product of time and phase current. The at least one fitting window can be determined based on a pulse width modulation synchronization pulse. The at least one fitting window can be further determined based on a switching state of the at least one motor winding. Filtering the subset of sampled data points can include performing a least squares fit. The phase current can be oversampled at a rate of at least two samples per pulse width modulation period. The method can also include determining a phase current for sampled data points corresponding to the at least one transient component based on the fit. The at least one motor parameter can include one or more of an inductance, a resistance, or a magnetization.

In an aspect, the disclosure can feature a motor control system such as for determining at least one motor parameter such as using an adaptive filter. The motor control system can include power circuitry that can be configured to deliver a phase voltage to a motor winding, the phase voltage causing a phase current to flow in the motor winding. The motor control system can also include a current sensor that can be configured to sense the phase current flowing in the motor winding. The motor control system can also include sampling circuitry that can be configured to convert the sensed phase current into a set of sampled data points. The motor control system can also include pulse width modulation timing circuitry such as for controlling the timing of the phase current delivered to the motor winding, the pulse width modulation timing circuitry determining at least one fitting window, the at least one fitting window excluding at least one transient component and including a subset of the sampled data points. The motor control system can also include an adaptive filter that can be configured to filter the subset of sampled data points corresponding to the at least one fitting window, the filtering determining at least one parameter of a fitting function. The motor control system can also include a motor controller that can be configured to determine the at least one motor parameter such as based on the determined at least one parameter of the fitting function. The fitting function can be a linear function. The at least one parameter of the fitting function can include a slope of the linear function. The at least one parameter of the fitting function can include an offset of the linear function. The adaptive filter can be configured to determine the slope and offset of the linear function such as based on central tendencies respectively of phase current, time, the product of phase current and time, and the square of time, such as wherein the central tendencies can be determined recursively. The at least one motor parameter can include one or more of an inductance, a resistance or a magnetization. The at least one motor parameter can include a flux linkage.

In an aspect, the disclosure can feature a method for determining at least one motor parameter such as using an adaptive filter in a motor control system. The method can include sampling at least one phase current being supplied to at least one motor winding to form a set of sampled data points. The method can also include selecting at least one fitting window based on at least one phase voltage being switched on and off between the at least one motor winding, the at least one fitting window selected to exclude at least one transient component of the at least one phase current and including a subset of the sampled data points. The method can also include filtering the subset of sampled data points corresponding to the at least one fitting window, to determine one or more of a slope and offset of a linear function. The method can also include determining the at least one motor parameter based on the determined at least one parameter of the fitting function. The method can also include determining a motor state based on the determined at least one motor parameter. The method can also include determining one or more of the slope and offset of the linear function such as can be based on one or more central tendencies respectively of phase current, time, the product of phase current and time, and the square of time, wherein the central tendencies can be determined recursively.

In an aspect, the disclosure can feature a motor control system for determining at least one motor parameter. The motor control system can include a means for sampling at least one phase current being supplied to at least one motor winding, such as to form a set of sampled data points. The means for sampling can include sampling circuitry, such as inverter feedback circuitry 130, analog-to-digital converter 155, and/or sample timers 140, such that as shown in FIG. 1. The motor control system can also include a means for analyzing the set of sampled data points, such as with a fitting function. The means for analyzing can include an adaptive filter, such as digital filter 150, such as that shown in FIG. 1. The motor control system can also include a means for determining at least one motor parameter, such as based on the determined at least one parameter of the fitting function. The means for determining can include motor control circuitry 185, such as that shown in FIG. 1.

Further features of the disclosure are provided in the detailed description and the appended claims, which features may optionally be combined with each other in any permutation or combination, unless expressly indicated otherwise elsewhere in this document.

BRIEF DESCRIPTION OF THE DRAWINGS

The present disclosure will now be described, by way of example, with reference to the accompanying drawings, in which:

FIG. 9A illustrates an example of expressions for the inductance in motor windings.

FIG. 9B illustrates a table of voltage vectors and corresponding expressions for inductances of the motor windings.

DETAILED DESCRIPTION OF EMBODIMENTS OF THE DISCLOSURE

Figure 1:
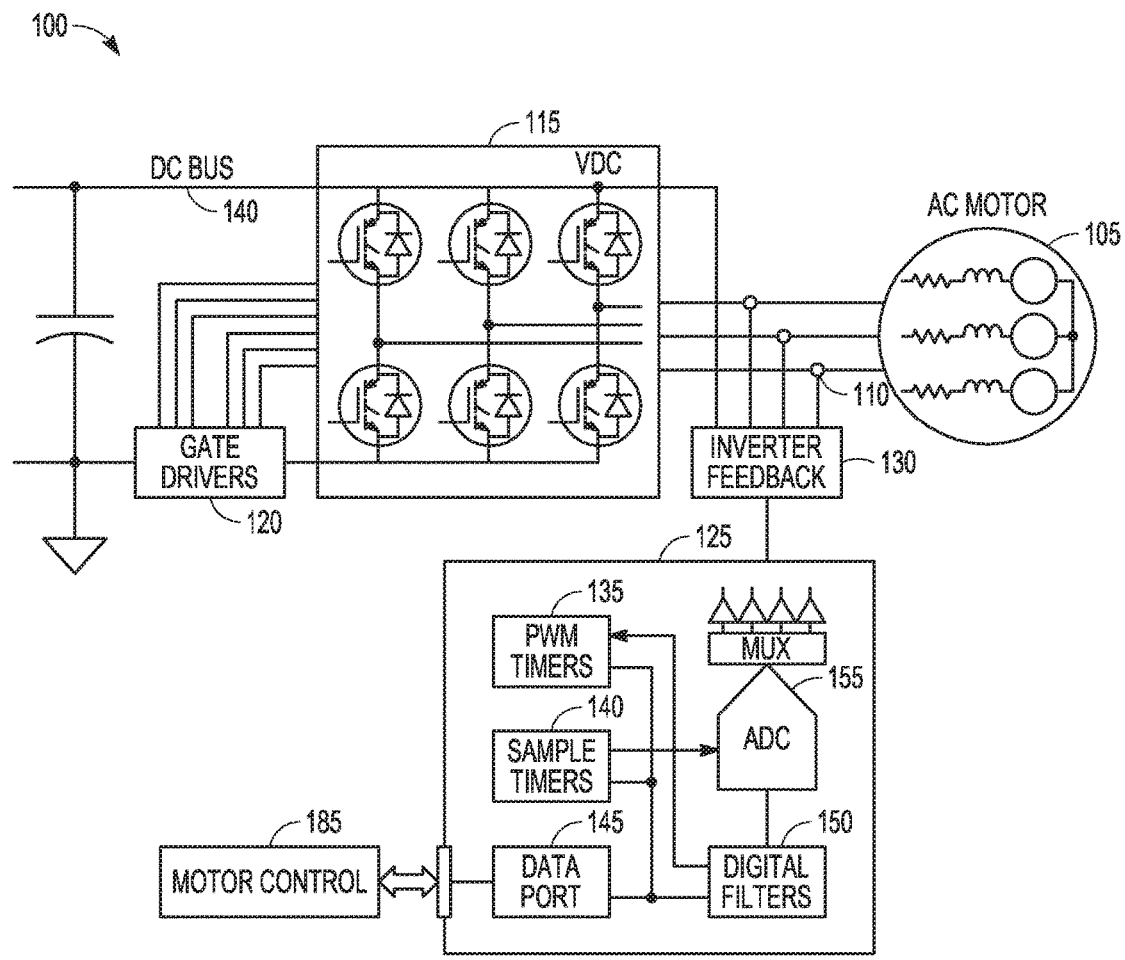
FIG. 1 illustrates a diagram of a motor control system.

A current control loop can ensure proper operation of a motor, for example by ensuring that a phase current follows a reference. The tuning of parameters in the current control loop can be based on motor parameters such as inductance, resistance, or magnetization. However, since the motor parameters are often unknown, it is often not possible to optimize tuning of the current control loop. Described below is a method to determine motor parameters such as to provide optimal tuning of a current control loop during operation of the motor. FIG. 1 shows an example of a motor control system 100. Motor control system 100 can include a motor 105, one or more sensors 110, a power inverter 115, one or more gate drivers 120, control circuitry 125, inverter feedback circuitry 130, and motor control circuitry 185. The power inverter can include one or more transistors 116. The inverter control circuitry can include one or more pulse width modulation timers 135, one or more sample timers 140, a data port 145, one or more digital filters 150, and an analog-to-digital converter 155. The DC bus can be electrically coupled to the power inverter 115 and the transistors 116. The transistors 116 can be electrically coupled to windings of the motor 105. The sensors 110 can be coupled to the electrical connection between the power inverter 115 and the motor 105. The current sensors can be electrically coupled or magnetically coupled to the connection between the power inverter 115 and the motor 105. Additionally, the current sensors can be electrically coupled to inverter feedback circuitry 130. The inverter feedback circuitry 130 can be electrically coupled to the control circuitry 125. The control circuitry 125 can be electrically coupled to gate drivers 120 and to motor control circuitry 185. The gate drivers 120 can be electrically coupled to the gates of transistors 116. The PWM timers 135, sample timers 140, data port 145, and digital filters 150 can be electrically connected to one another such as via a common bus. The analog-to-digital converter 155 can be electrically coupled to the digital filters 150 and the inverter feedback circuitry 130. During operation, the transistors 116 may receive DC power from the DC supply bus and provide AC power to the motor 105. The control circuitry 125 can provide one or more control signals to the gate drivers 120 and the gate drivers 120 can energize the gates of transistors 116 such as to provide a sequence of electrical pulses to the windings of the motor 105 such as to cause the rotor of motor 105 to turn. The sensors 110 can sense a current or voltage associated with the motor windings and provide the sensed signal to inverter feedback circuitry 130. The inverter feedback circuitry 130 can provide the sensed signal to the analog-to-digital converter 155. The analog-to-digital converter 155 can convert the sensed signal into digital samples. The analog-to-digital converter 155 can be configured to oversample the sensed signal. The oversampling can include sampling the sensed signal more than once every PWM period. The digital filters 150 may receive the digital samples and may apply a digital filter to the digitized sensed signal. For example, the digital filters can apply a least mean squares fit to the received signal. The sample timers 140 may generate timing signals for the PWM timers 135, the data port 145, the analog-to-digital converter 155, and the digital filters 150. The sample timer can make use of PWM timing information such as to avoid noise generated by switching of transistors 116. The motor control circuitry 185 can provide high level control algorithms to the control circuitry 125 such as via the data port 145.

Figures 2, 3:
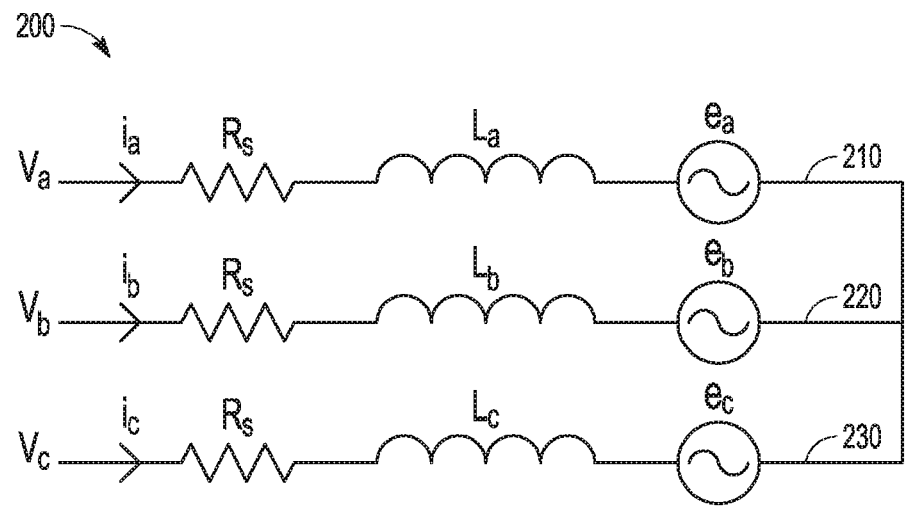
FIG. 2 illustrates a diagram showing a set of motor windings.
FIG. 3 illustrates a table of voltage vectors and corresponding applied voltages to the motor windings.
Figure 4A:
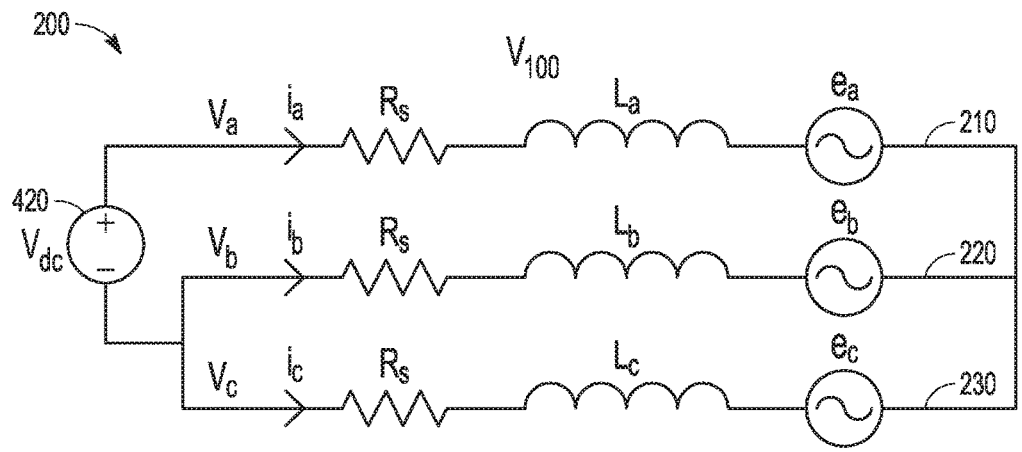
FIGS. 4A-4C illustrate examples of voltage vectors being applied to the motor windings.
Figure 4B:
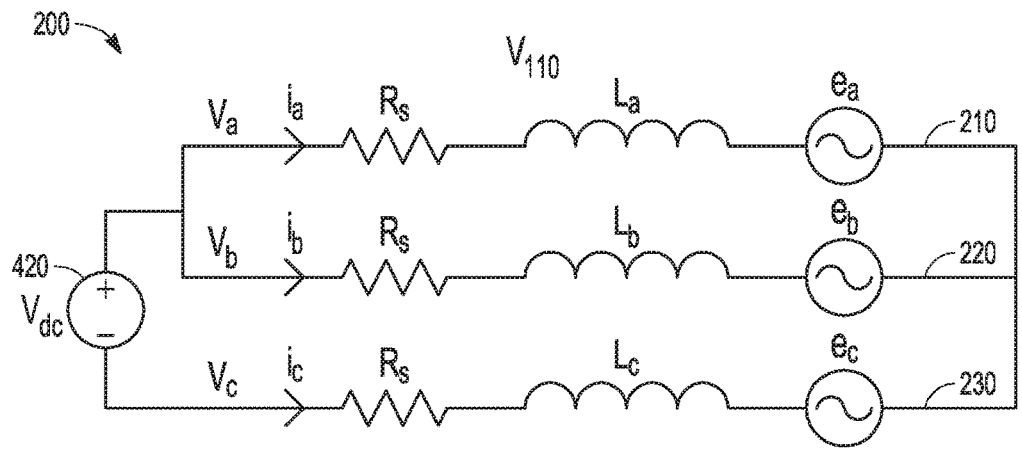
Figure 4C:
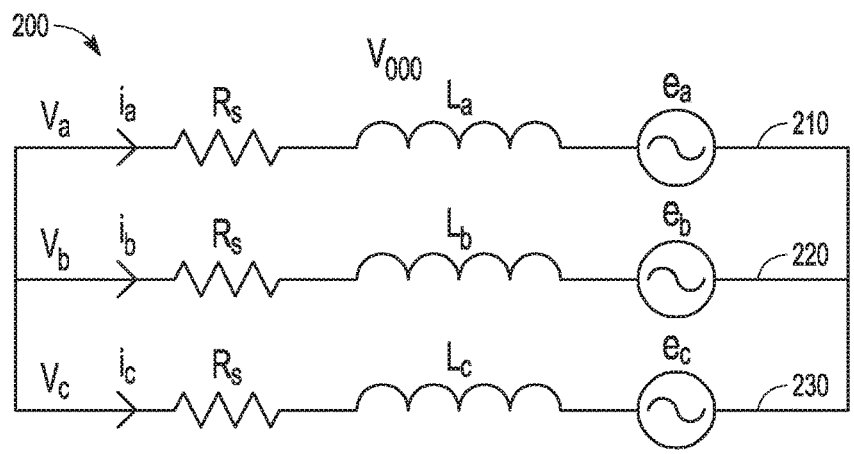

FIG. 2 shows an example of motor windings 200. The motor windings 200 may include a first motor winding 210, a second motor winding 220, and a third motor winding 230. In an example, the motor 200 can include any number of windings. The first motor winding may include an inductance $L_a$, a resistance Rs, and an electromotive force $e_a$. The second motor winding may include an inductance $L_b$, a resistance Rs, and an electromotive force $e_b$. The third motor winding may include an inductance $L_c$, a resistance Rs, and an electromotive force $e_c$. During operation, the PMW timers 135 may provide one or more timing signals to the gate drivers 120, such as which can control the transistors 116 such as to adjust the voltages applied to the motor windings 210, 220, and 230 such as to cause a current to flow in the motor windings, which in turn, causes the rotor of motor 105 to turn. For example, a motor having three motor windings may have several switching states corresponding to various voltage vectors, including those shown in FIG. 3. FIG. 3 shows a table 300 of voltage vectors and corresponding applied voltages to the motor windings 200. For example, FIG. 3 shows a voltage vector $V_{100}$ that corresponds to applying a voltage $V_{dc}$ to the first motor winding 210, and applying a voltage of zero to the second motor winding 220 and the third motor winding 230. FIG. 4A shows an example of a voltage vector $V_{100}$ being applied to the motor windings 200, where a voltage $V_{dc}$ is applied to the first motor winding 210, and a voltage of zero volts is applied to the second motor winding 220 and the third motor winding 230. FIG. 4B shows an example of a voltage vector $V_{110}$ being applied to the motor windings 200, where a voltage $V_{dc}$ is applied to the first motor winding 210 and the second motor winding 220, and a voltage of zero volts is applied to the third motor winding 230. FIG. 4C shows an example of a voltage vector $V_{000}$ being applied to the motor windings 200, where a voltage of zero volts is applied to the first motor winding 210, the second motor winding 220, and the third motor winding 230.

Figure 5:
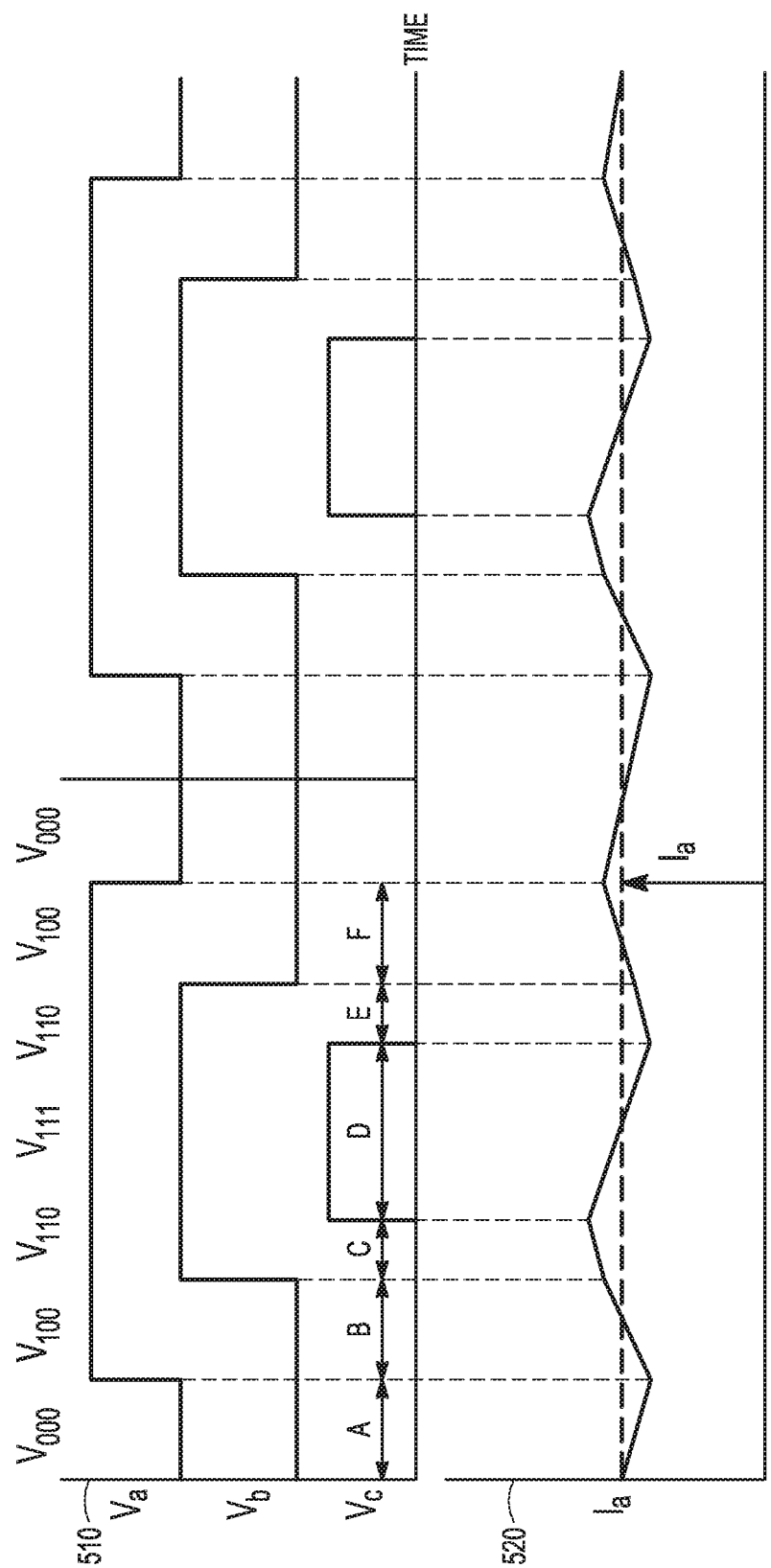
FIG. 5 illustrates a sequence of voltage vectors being applied to the motor windings.

FIG. 5 shows a conceptual example of a sequence of voltage vectors being applied to the motor windings 200 to cause the rotor of motor 105 to turn. The upper portion 510 of FIG. 5 illustrates voltage vectors that may be applied to the motor windings 200 plotted as a function of time. The lower portion 520 of FIG. 5 illustrates the current that may flow in the first motor winding 210 in response to the applied voltage vectors. In a first region A, a voltage vector $V_{000}$ is applied to the motor windings by applying zero volts to the first motor winding 210, zero volts to the second motor winding 220, and zero volts to the third motor winding 230. In a second region B and a sixth region F, a voltage vector $V_{100}$ is applied to the motor windings by applying a voltage $V_{dc}$ to the first motor winding 210, zero volts to the second motor winding 220, and zero volts to the third motor winding 230. In a third region C and a fifth region E, a voltage vector $V_{110}$ is applied to the motor windings by applying a voltage $V_{dc}$ to the first motor winding 210, a voltage $V_{dc}$ to the second motor winding 220, and zero volts to the third motor winding 230. In a fourth region D, the voltage vector $V_{111}$ is applied to the motor windings by applying a voltage $V_{dc}$ to the first motor winding 210, the second motor winding 220, and the third motor winding 230.

Figure 6:
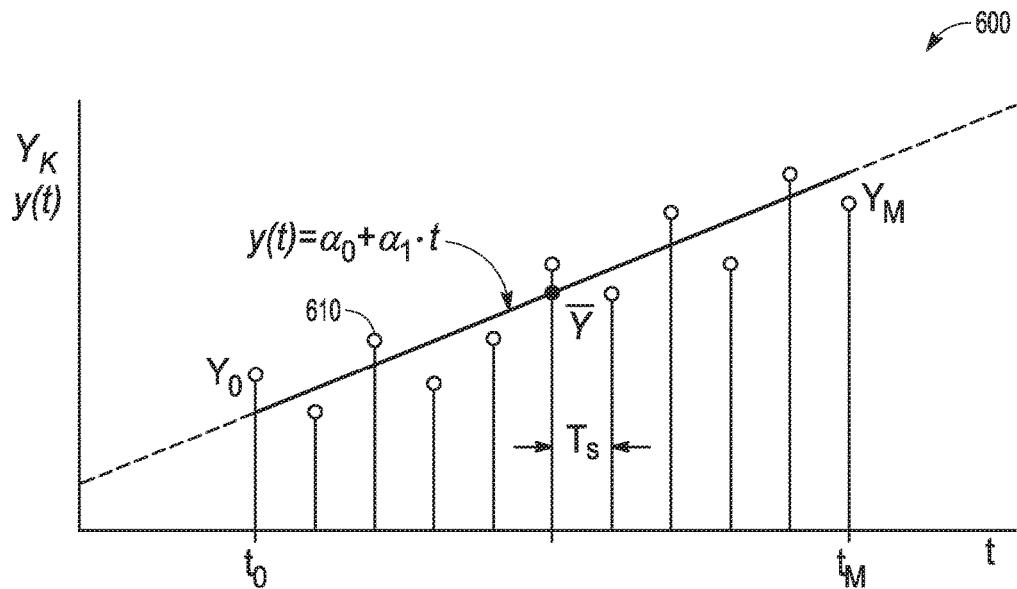
FIG. 6 is a diagram showing a least squares fit to a set of digital samples.

FIG. 6 shows a conceptual example 600 of a least mean squares fit being applied to a set of digital samples 610 such as to determine the slope and offset of a phase current travelling through a motor winding. The digital samples 610 may have a time value (e.g., $t_0 \ldots t_M$) and a phase current value (e.g., $Y_0 \ldots Y_M$), and a sampling period of $T_s$. The digital samples may be provided to the digital filters 150 by the analog-to-digital converter 155. The digital filters 150 may be configured to determine a slope and an offset of a linear equation having parameters $\alpha_0$ and $\alpha_1$. The digital filters 150 may determine the offset and slope based on the following relationships:

$$\alpha_1 = \frac{\sum_{k=0}^{M}(t_k \cdot Y_k - (\bar{t})(\bar{Y}))}{\sum_{k=0}^{M}(t_k^2 - \bar{t}^2)}$$

$$\alpha_0 = \bar{Y} - \alpha_1 \cdot \bar{t}$$

For example, the slope $\alpha_1$ can be determined based on the square of an average of time, the average value of time squared, the average value of the product of time and phase current, and a product of the average value of current and the average value of time. The offset $\alpha_0$ can be determined based on the average value of phase current, and average value of time, and the determined slope $\alpha_1$. The slope and offset may be determined recursively. The average value of current can be provided to the motor control circuitry 185 such as for purposes of motor control. The determined slope $\alpha_1$, and the determined offset $\alpha_0$ can be provided to the motor control circuitry 185, and the motor control circuitry 185 can determine at least one motor parameter, such as based in part on the provided slope $\alpha_1$, and offset $\alpha_0$. In an example, the time values of the digital samples can be defined such that $\bar{t}=0$. In such an example where $\bar{t}=0$, the offset and slope can be determined by the following relationships:

$$\alpha_1 = \frac{\overline{t \cdot Y} - \bar{t} \cdot \bar{Y}}{\overline{t^2} - \bar{t}^2} = \frac{\overline{t \cdot Y}}{\overline{t^2}}$$

$$\alpha_0 = \bar{Y}$$

Figure 7:
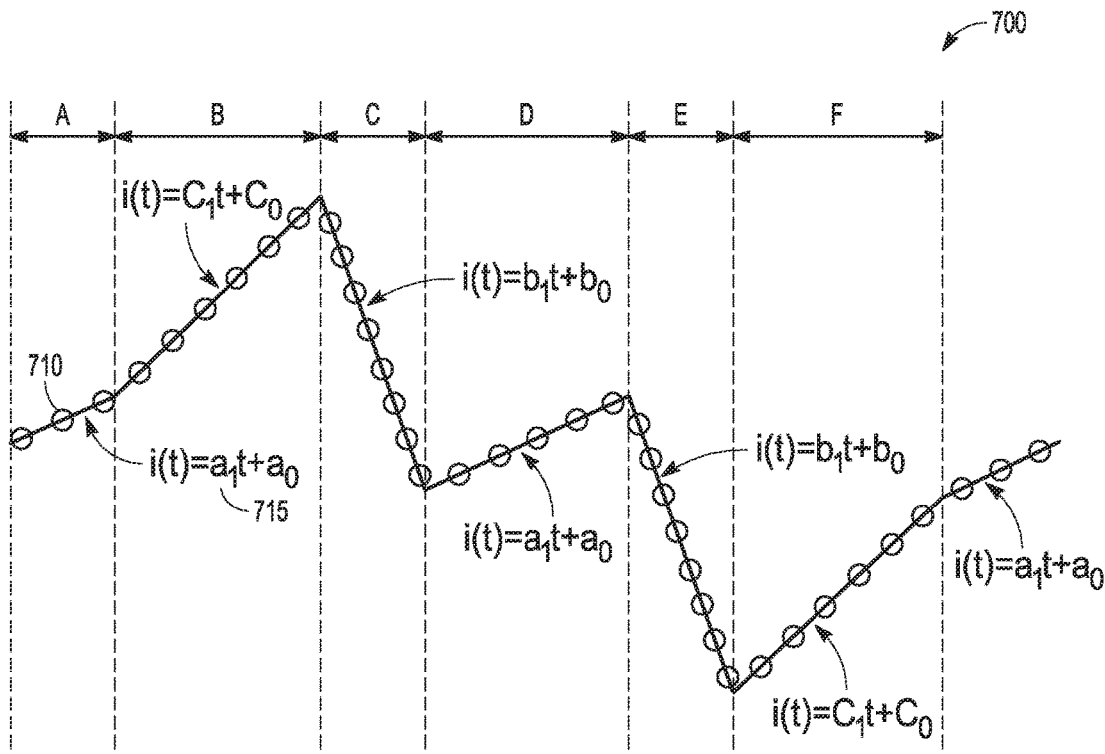
FIG. 7 illustrates an example of a motor winding current waveform during a full PWM switching cycle and a series of least squares fits.

FIG. 7 illustrates an example of a motor winding current waveform during a full PWM switching cycle. The motor winding current waveform 700 can include digital samples 710. The motor winding current waveform can have six distinct regions, each corresponding to a switching state of the power inverter, such as a switching state shown in FIG. 2. Each region of digital samples can be fitted to a linear equation 715, such as using a least squares fit. The least squares fit can be applied to a subset of each region such as to avoid including transients associated with changing the voltages being applied to the motor windings 200. Motor parameters may be determined based on the determined slope of the motor winding current.

Figure 7A:
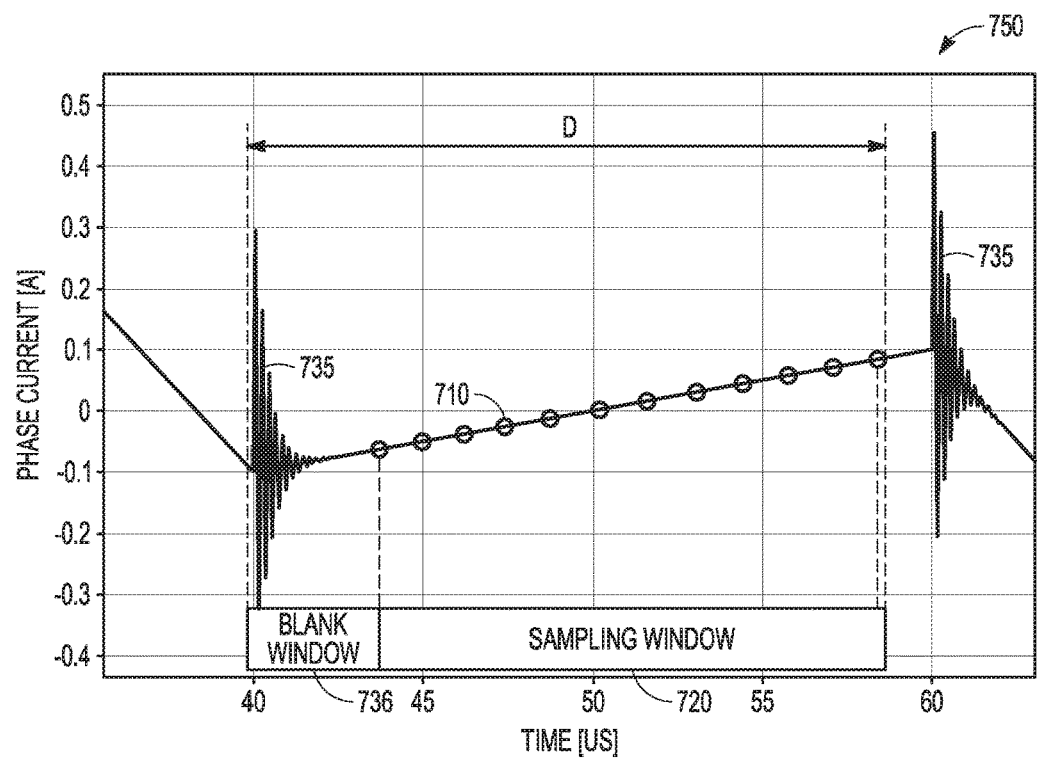
FIG. 7A illustrates an example of a sampling window.

FIG. 7A illustrates an example of a motor winding current waveform 750 corresponding to a switching state of the power inverter, such as that shown in region D of FIG. 7. The motor winding current waveform can include digital samples 710, transient regions 735, a blanking window 736, and a sampling window 720. The transients 735 can occur during a change in a switching state of the power inverter and can adversely affect a least squares fit if applied to a set of digital samples that include the transients 735. The blanking window 736 can define a region, such as where transients may be present in the measured phase current and the sampling window 720 can be selected to define a region where transients may not be present. Digital samples 710 can be collected during sampling window 720, but not during the blanking window 736, such as to avoid transients being included in the digital samples 710. A fitting window, such as where a least squares fit can be applied, can include the digital samples 710 acquired during the sampling window.

Figure 8:
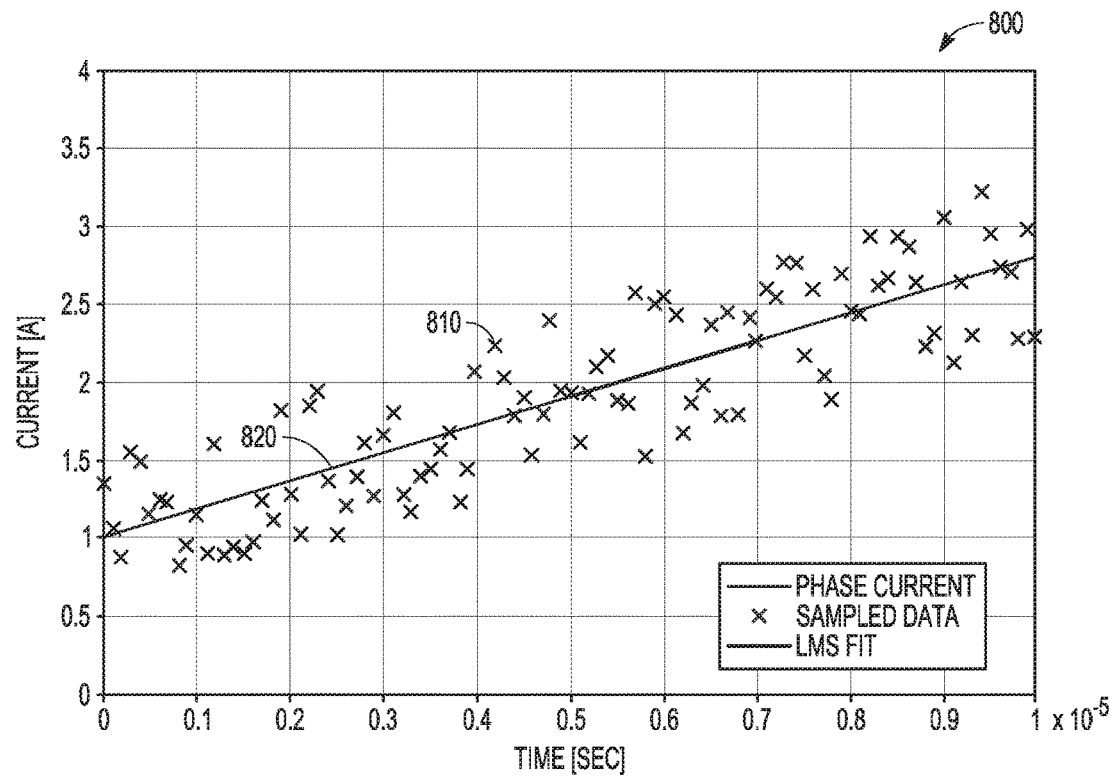
FIG. 8 illustrates an example of a least squares fit to digital samples of a motor winding current.

FIG. 8 illustrates a graph 800 of a least squares fit to digital samples of a motor winding current. The graph 800 includes a collection of digital samples 810 and a line 820 having a slope and an offset based on the results of the least squares fit.

Figure 9:
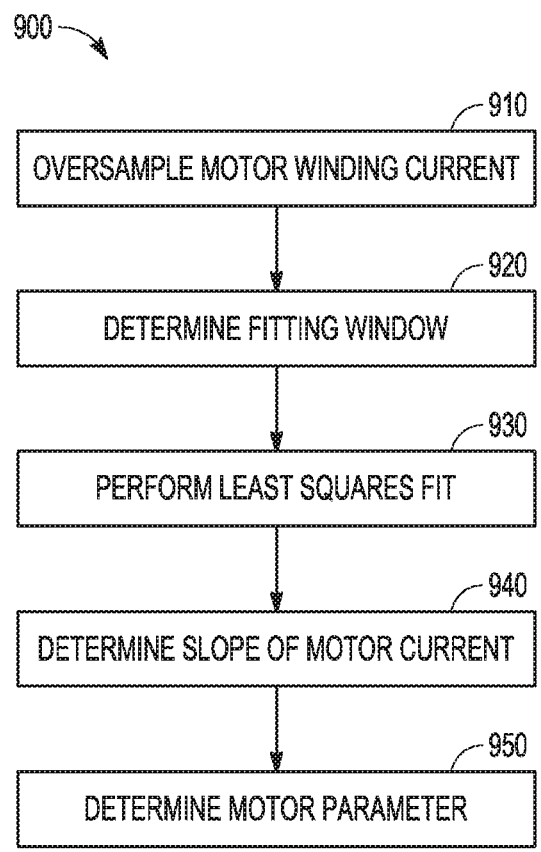
FIG. 9 illustrates a method of operation of motor control system for determining at least one motor parameter.

FIG. 9 shows a method of operation of motor control system 100 for determining at least one motor parameter. The analog-to-digital converter 155 may oversimple the winding currents provided by the inverter feedback circuitry 130 such as to acquire digital samples (step 910). For example, oversampling can include sampling the winding currents more than once for each switching state of the power inverter 115. A fitting window may be determined for each switching state of the power inverter 115 (step 920). The fitting windows may be selected to exclude transient behavior such as can be induced by changes in the transistors 116 of the power inverter 115. A least squares fit may performed on the digital samples (step 930). For example, a least squares fit may be performed for each fitting window corresponding to a switching state of the power inverter 115.

In some embodiments, a slope of the winding current may be determined based on the least squares fit (step 940). The least squares fit may be implemented recursively based on a recursive calculation of average values. For example, an average value can be recursively calculated based on the following equation:

$$\bar{x}[n] = \bar{x}[n-1] + \frac{x[n] - \bar{x}[n-1]}{n}$$

Where $\bar{x}[n]$, is an average value based on the first through $n^{th}$ digital samples and n can be in the range of 1 to M, where M is the number of acquired digital samples and $\bar{x}[1]=x[1]$. A motor parameter may be determined based on the determined slopes of the winding currents (step 950). A system of equations can be determined for each of the applied voltage vectors during operation of the motor 105. An inductance of the motor windings can be determined based on the slope of current in the motor windings for two switching states voltage vectors $V_{100}$ and $V_{000}$). The slope of current in the motor windings may be determined by digitally sampling the current in the motor windings and applying a least squares fit. For a voltage vector $V_{100}$, the following equations may describe the system shown in FIG. 4A:

$$V_{dc} = \left(i_a^{V100} \cdot R_s + L_a \cdot \frac{di_a^{V100}}{dt} + e_a^{V100}\right) - \left(i_b^{V100} \cdot R_s + L_b \cdot \frac{di_b^{V100}}{dt} + e_b^{V100}\right)$$

$$0 = \left(i_b^{V100} \cdot R_s + L_b \cdot \frac{di_b^{V100}}{dt} + e_b^{V100}\right) - \left(i_c^{V100} \cdot R_s + L_c \cdot \frac{di_c^{V100}}{dt} + e_c^{V100}\right) - V_{dc} = \left(i_c^{V100} \cdot R_s + L_c \cdot \frac{di_c^{V100}}{dt} + e_c^{V100}\right) - \left(i_a^{V100} \cdot R_s + L_a \cdot \frac{di_a^{V100}}{dt} + e_a^{V100}\right)$$

For voltage vector $V_{000}$, the following equations may describe the system shown in FIG. 4C:

$$0 = \left(i_a^{V000} \cdot R_s + L_a \cdot \frac{di_a^{V000}}{dt} + e_a^{V000}\right) - \left(i_b^{V000} \cdot R_s + L_b \cdot \frac{di_b^{V000}}{dt} + e_b^{V000}\right)$$

$$0 = \left(i_b^{V000} \cdot R_s + L_b \cdot \frac{di_b^{V000}}{dt} + e_b^{V000}\right) - \left(i_c^{V000} \cdot R_s + L_c \cdot \frac{di_c^{V000}}{dt} + e_c^{V000}\right)$$

$$0 = \left(i_c^{V000} \cdot R_s + L_c \cdot \frac{di_c^{V000}}{dt} + e_c^{V000}\right) - \left(i_a^{V000} \cdot R_s + L_a \cdot \frac{di_a^{V000}}{dt} + e_a^{V000}\right)$$

The resistance of the motor windings may be neglected and the back emf voltages may be assumed to be the same for the two switching states corresponding to the voltage vectors $V_{100}$ and $V_{000}$ (e.g., $e_a^{V000}=e_a^{V100}=e_a$, $e_b^{V000}=e_b^{V100}=e_b$, and $e_c^{V000}=e_c^{V100}=e_c$). Based on this assumption, the equations describing the system for an applied voltage vectors $V_{100}$ and $V_{000}$ may be simplified as follows:

$$L_a \cdot \frac{di_a^{V100}}{dt} - V_{dc} - e_a + L_b \cdot \frac{di_b^{V100}}{dt} + e_b$$

$$L_b \cdot \frac{di_b^{V100}}{dt} = -e_b + L_c \cdot \frac{di_c^{V100}}{dt} + e_c$$

$$L_c \cdot \frac{di_c^{V100}}{dt} = -V_{dc} - e_c + L_a \cdot \frac{di_a^{V100}}{dt} + e_a$$

-continued $$L_a \cdot \frac{di_a^{V000}}{dt} = -e_a + L_b \cdot \frac{di_b^{V000}}{dt} + e_b$$

$$L_b \cdot \frac{di_b^{V000}}{dt} = -e_b + L_c \cdot \frac{di_c^{V000}}{dt} + e_c$$

$$L_c \cdot \frac{di_c^{V000}}{dt} = -e_c + L_a \cdot \frac{di_a^{V000}}{dt} + e_a$$

These equations may be further simplified by defining the following differences in current derivatives:

$$\left(\frac{di_a^{V100}}{dt} - \frac{di_a^{V000}}{dt}\right) = \Delta di_{a1}$$

$$\left(\frac{di_b^{V100}}{dt} - \frac{di_b^{V000}}{dt}\right) = \Delta di_{b1}$$

$$\left(\frac{di_c^{V100}}{dt} - \frac{di_c^{V000}}{dt}\right) = \Delta di_{c1}$$

Based on the defined differences in the current derivatives, the equations describing the system for applied voltage vectors $V_{100}$ and $V_{000}$ may be further simplified as follows:

$$L_a = \frac{V_{dc} + L_b \cdot \Delta di_{b1}}{\Delta di_{a1}}$$

$$L_b = \frac{L_c \cdot \Delta di_{c1}}{\Delta di_{b1}}$$

$$L_c = \frac{-V_{dc} + L_a \cdot \Delta di_{a1}}{\Delta di_{c1}}$$

FIG. 9B shows a table 990 of a set of equations for inductances $L_a$, $L_b$, and $L_c$ corresponding to the 6 active voltage vectors.

Where the motor has no saliency, $L_a = L_b = L_c = L$, and the inductance may be determined from any of the above simplified equations as follows:

$$L = \frac{V_{dc}}{\Delta di_{a1} - \Delta di_{b1}}$$

Where the motor has a saliency, $L_a$, $L_b$, and $L_c$ are not equal and an inductance of the motor windings can be determined based on the switching states corresponding to one active voltage vector and $V_{000}$ and by taking into account a position of the rotor. The rotor position can be assumed constant between the two switching states corresponding to applied voltage vectors. The inductances can be expressed as follows:

$$L_a = L_0 + \Delta L \cdot \cos(2 \cdot PP \cdot \theta_r) = L_0 + \Delta L \cdot k_a$$

$$L_b = L_0 + \Delta L \cdot \cos\left(2 \cdot PP \cdot \theta_r - \frac{2\pi}{3}\right) = L_0 + \Delta L \cdot k_b$$

$$L_c = L_0 + \Delta L \cdot \cos\left(2 \cdot PP \cdot \theta_r - \frac{4\pi}{3}\right) = L_0 + \Delta L \cdot k_c$$

where $\theta_r$ represents an angle of the rotor, and PP represents a number of pole pairs. The expressions for the inductances can be further simplified as follows:

$$L_a = L_0 + \Delta L \cdot k_a = \frac{L_d + L_q}{2} + \frac{L_d - L_q}{2} \cdot k_a = \frac{L_d \cdot (1 + k_a) + L_q(1 - k_a)}{2}$$

$$L_b = L_0 + \Delta L \cdot k_b = \frac{L_d + L_q}{2} + \frac{L_d - L_q}{2} \cdot k_b = \frac{L_d \cdot (1 + k_b) + L_q(1 - k_b)}{2}$$

$$L_c = L_0 + \Delta L \cdot k_c = \frac{L_d + L_q}{2} + \frac{L_d - L_q}{2} \cdot k_c = \frac{L_d \cdot (1 + k_c) + L_q(1 - k_c)}{2}$$

where $L_d$ represents an inductance when the rotor is aligned with the motor windings, and $L_q$ represents an inductance when the rotor is aligned with gaps between the motor windings. The above equations describing the inductances can be further simplified as follows:

$$L_a = L_d \cdot k_{ad} + L_q \cdot k_{aq}$$

$$L_b = L_d \cdot k_{bd} + L_q \cdot k_{bq}$$

$$L_c = L_d \cdot k_{cd} + L_q \cdot k_{cq}$$

where $$k_{ad} = \frac{(1 + k_a)}{2}, k_{aq} = \frac{(1 - k_a)}{2}, k_{bd} = \frac{(1 + k_b)}{2}, k_{bq} = \frac{(1 - k_b)}{2},$$

$$k_{cd} = \frac{(1 + k_c)}{2}, \text{ and } k_{cq} = \frac{(1 - k_c)}{2}.$$

With these modified inductance equations substituted into the general equations in FIG. 9B, the inductances $L_d$ and $L_q$ can be determined as shown in FIG. 9A.

In examples where the rotor position is not known, an inductance of the motor windings can be determined based on the slope of current in the motor windings for three switching states (e.g., voltage vectors $V_{100}$, $V_{000}$, and $V_{110}$). The slope of current in the motor windings may be determined by digitally sampling the current in the motor windings and applying a least squares fit. For a voltage vector $V_{110}$, the following equations may describe the system shown in FIG. 4B:

$$0 = \left(i_a^{V110} \cdot R_s + L_a \cdot \frac{di_a^{V110}}{dt} + e_a^{V110}\right) - \left(i_b^{V110} \cdot R_s + L_b \cdot \frac{di_b^{V110}}{dt} + e_b^{V110}\right)$$

$$-V_{dc} = \left(i_b^{V110} \cdot R_s + L_b \cdot \frac{di_b^{V110}}{dt} + e_b^{V110}\right) - \left(i_c^{V110} \cdot R_s + L_c \cdot \frac{di_c^{V110}}{dt} + e_c^{V110}\right)$$

$$V_{dc} = \left(i_c^{V110} \cdot R_s + L_c \cdot \frac{di_c^{V110}}{dt} + e_c^{V110}\right) - \left(i_a^{V110} \cdot R_s + L_a \cdot \frac{di_a^{V110}}{dt} + e_a^{V110}\right)$$

The resistance of the motor windings may be neglected and the back emf voltages may be assumed to be the same for the three switching states corresponding to the voltage vectors $V_{100}$, $V_{000}$, and $V_{110}$ (e.g., $e_a^{V000} = e_a^{V100} = e_a^{V110} = e_a$, $e_b^{V000} = e_b^{V100} = e_b^{V110} = e_b$, and $e_c^{V000} = e_c^{V100} = e_c^{V110} = e_c$). Based on this assumption, the equations describing the system for applied voltage vectors $V_{110}$ and $V_{000}$ may be simplified as follows:

$$L_a \cdot \frac{di_a^{V110}}{dt} = -e_a + L_b \cdot \frac{di_b^{V110}}{dt} + e_b$$

$$L_b \cdot \frac{di_b^{V110}}{dt} = -V_{dc} - e_b + L_c \cdot \frac{di_c^{V110}}{dt} + e_c$$

-continued $$L_c \cdot \frac{di_c^{V110}}{dt} = V_{dc} - e_c + L_a \cdot \frac{di_a^{V110}}{dt} + e_a$$

$$L_a \cdot \frac{di_a^{V000}}{dt} = -e_a + L_b \cdot \frac{di_b^{V000}}{dt} + e_b$$

$$L_b \cdot \frac{di_b^{V000}}{dt} = -e_b + L_c \cdot \frac{di_c^{V000}}{dt} + e_c$$

$$L_c \cdot \frac{di_c^{V000}}{dt} = -e_c + L_a \cdot \frac{di_a^{V000}}{dt} + e_a$$

These equations may be further simplified by defining the following differences in current derivatives:

$$\left( \frac{di_a^{V110}}{dt} - \frac{di_a^{V000}}{dt} \right) = \Delta di_{a2}$$

$$\left( \frac{di_b^{V110}}{dt} - \frac{di_b^{V000}}{dt} \right) = \Delta di_{b2}$$

$$\left( \frac{di_c^{V110}}{dt} - \frac{di_c^{V000}}{dt} \right) = \Delta di_{c2}$$

Based on the defined differences in the current derivatives, the equations describing the system for applied voltage vectors $V_{110}$ and $V_{000}$ may be further simplified as follows:

$$L_a = \frac{L_b \cdot \Delta di_{b2}}{\Delta di_{a2}}$$

$$L_b = \frac{-V_{dc} + L_c \cdot \Delta di_{c2}}{\Delta di_{b2}}$$

$$L_c = \frac{V_{dc} + L_a \cdot \Delta di_{a2}}{\Delta di_{c2}}$$

The three equations above, combined with the three equations determined previously for applied voltage vectors $V_{100}$ and $V_{000}$ may be used to determine the inductances of the motor windings based on the slope of the current in the motor windings and the applied voltage as follows:

$$L_a = \frac{V_{dc}(\Delta di_{c1} + \Delta di_{c2})}{\Delta di_{a1}\Delta di_{c2} - \Delta di_{a2}\Delta di_{c1}}$$

$$L_b = \frac{V_{dc}\Delta di_{a2}}{\Delta di_{b2}\Delta di_{a1} - \Delta di_{b1}\Delta di_{a2}}$$

$$L_c = \frac{-V_{dc}\Delta di_{b1}}{\Delta di_{c1}\Delta di_{b2} - \Delta di_{c2}\Delta di_{b1}}$$

If the inductance is changing as a function of current it may indicate a saturation condition. The determined inductances may be used to detect a fault condition such as rotor demagnetization, isolation failure, and winding shorts. Higher order (e.g., non-linear) adaptive filters can be used to fit a non-linear function to the motor winding current such as to determine second order effects on the motor winding current such as one or more switching transients such as can be due to cable capacitance and magnetic core losses.

A resistance of the motor windings, and back emf voltages of the motor windings can be determined based on the following equations:

$$v_{an} = e_a + R_a i_a + L_a \frac{di_a}{dt}$$

$$v_{bn} = e_b + R_b i_b + L_b \frac{di_b}{dt}$$

$$v_{cn} = e_c + R_c i_c + L_a \frac{di_c}{dt}$$

where $v_{an}$ represents the voltage across a first motor winding, such as motor winding 210 as shown in FIG. 2, $i_a$ represents a current flowing in the first motor winding, $e_a$ represents a back emf in the first motor winding, $R_a$ represents a resistance of the first motor winding, $L_a$ represents an inductance of the first motor winding, $$\frac{di_a}{dt}$$

represents a slope of the current in the first motor winding, $v_{bn}$ represents the voltage across a second motor winding, such as motor winding 220 as shown in FIG. 2, $i_b$ represents a current flowing in the second motor winding, $e_b$ represents a back emf in the second motor winding, $R_b$ represents a resistance of the second motor winding, $L_b$ represents an inductance of the second motor winding, $$\frac{di_b}{dt}$$

represents a slope of the current in the second motor winding, $v_{cn}$ represents the voltage across a third motor winding, such as motor winding 230 as shown in FIG. 2, $i_c$ is a current flowing in the third motor winding, $e_c$ represents a back emf in the third motor winding, $R_c$ represents a resistance of the third motor winding, $L_c$ represents an inductance of the third motor winding, $$\frac{di_c}{dt}$$

represents a slope of the current in the third motor w winding. The inductances $L_a$, $L_b$, and $L_c$ can be determined as described above, the currents, voltages, and slopes of currents can be measured as described above, the resistances in the motor windings can be assumed to be equal (e.g., $R_a = R_b = R_c$) and the back emf in each winding can be expressed as follows:

$$e_a = k_e \cdot PP \cdot \omega_r \cdot \sin(PP \cdot \theta_r)$$

$$e_b = k_e \cdot PP \cdot \omega_r \cdot \sin\left(PP \cdot \theta_r - \frac{2\pi}{3}\right)$$

$$e_c = k_e \cdot PP \cdot \omega_r \cdot \sin\left(PP \cdot \theta_r - \frac{4\pi}{3}\right)$$

where $\omega_r$ represents the angular speed of the rotor, $\theta_r$ represents the angular position of the rotor and PP represents the number of pole-pairs. Based on the above equations, the resistances R and the back emfs, $e_a$, $e_b$, and $e_c$ can be determined. In such an example where motor parameters, such as resistance, inductance, and back emf can be determined, a current control loop of the motor can be tuned, such as based on the determined motor parameters to provide optimal tuning of the current control loop. For example, a rise time, overshoot, or settling time can be optimized based on the determined motor parameters. In such an example where motor parameters, such as resistance, inductance, and back emf can be determined, non-linear behavior of the motor can be compensated for based on the determined motor parameters. For example, a torque produced by the motor can be determined based on the determined inductance and the current control loop can be tuned accordingly to compensate. The above described methods can be used to determine the motor parameters during operation of the motor and can allow for a periodic adjustment of the current control loop parameters to compensate for changes in the motor parameters, such as due to temperature or age.

Figure 10:
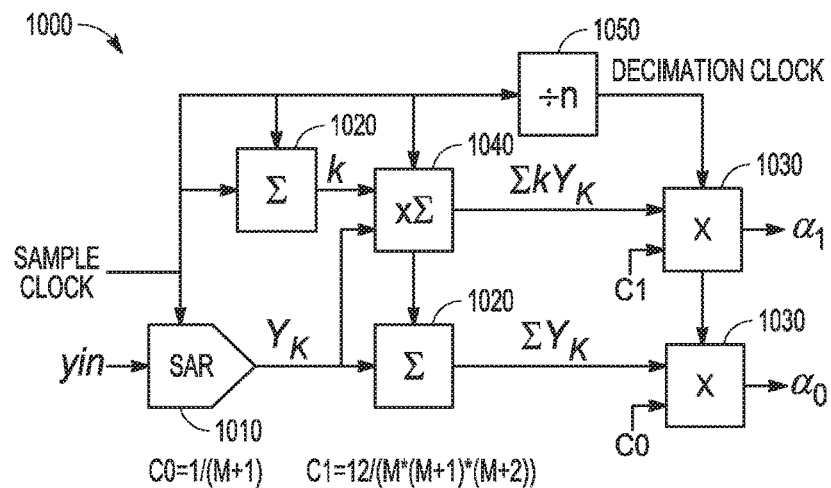
FIG. 10 illustrates a diagram showing an implementation of an adaptive filter for performing a least squares fit to a set of digital samples of a motor winding current.

FIG. 10 is a diagram showing an implementation of an adaptive filter 1000 such as for performing a least squares fit to a set of digital samples of a motor winding current. The linear function may have a slope $\alpha_1$ and offset $\alpha_0$. The adaptive filter 1000 can include an analog-to-digital converter (ADC) 1010, summers 1020, multipliers 1030, combination multiplier and summer 1040, and decimator 1050. C1 and C2 can be scalar multipliers and can be equal to 1/(M+1) and 12/(M*(M+1)*(M+2)), respectively, where M is the number of acquired digital samples. During operation, the winding current can be sampled by the ADC 1010 and converted to a set of digital samples. The digital samples can then be processed by the adaptive filter 1000 such as to perform a least squares fit such as in accordance with the diagram shown in FIG. 10. The slope $\alpha_1$ and offset $\alpha_0$ of the linear function can be provided as outputs of the adaptive filter 1000 where $\alpha_0$ and $\alpha_1$ can be calculated as follows:

$$\alpha_0 = \frac{\sum_{k=-\frac{M}{2}}^{+\frac{M}{2}} (Y_k)}{M+1}$$

$$\alpha_1 = \frac{\sum_{k=-\frac{M}{2}}^{+\frac{M}{2}} (k \cdot Y_k)}{T_s \left( \frac{M(M+1)(M+2)}{12} \right)}$$

Figure 11:
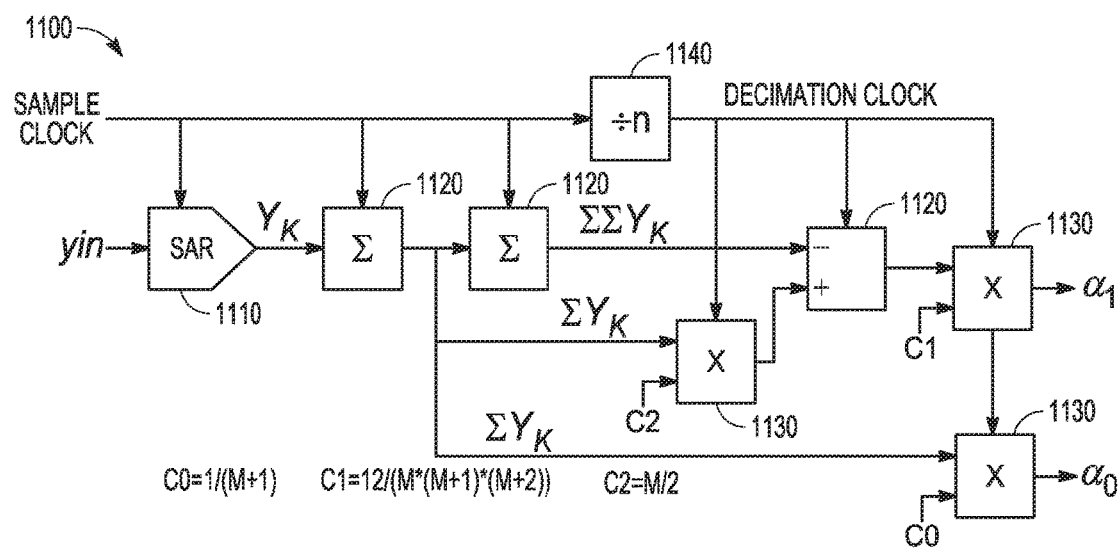
FIG. 11 illustrates a diagram showing an implementation of an adaptive filter for performing a least squares fit to a set of digital samples of a motor winding current.

FIG. 11 is a diagram showing an implementation of an adaptive filter 1100 for performing a least squares fit to a set of digital samples of a motor winding current. The linear function may have a slope $\alpha_1$ and offset $\alpha_0$. The adaptive filter 1100 can include an analog-to-digital converter (ADC) 1110, one or more summers 1120, one or more multipliers 1130, and decimator 1040. C0, C1 and C2 can be scalar multipliers and can be equal to 1/(M+1), 12/(M*(M+1)*(M+2)), and M/2 respectively, such as where M is the number of acquired digital samples. During operation, the winding current can be sampled by the ADC 1110 and converted to a set of digital samples. The digital samples can then be processed by the adaptive filter 1100 such as to perform a least squares fit such as in accordance with the diagram shown in FIG. 11. The slope $\alpha_1$ and offset $\alpha_0$ of the linear function can be provided as outputs of the adaptive filter 1100 where $\alpha_0$, and $\alpha_1$ can be calculated as follows:

$$\alpha_0 = \frac{\sum_{k=-\frac{M}{2}}^{+\frac{M}{2}} (Y_k)}{M+1}$$

$$\alpha_1 = \frac{\sum_{k=-\frac{M}{2}}^{+\frac{M}{2}} (k \cdot Y_k)}{T_s \left( \frac{M(M+1)(M+2)}{12} \right)}$$

The invention claimed is:

1. A method for determining at least one motor parameter using an adaptive filter in a motor control system, the method comprising:
    sampling at least one phase current being supplied to at least one motor winding to form a set of sampled data points;
    filtering a subset of the set of sampled data points to determine at least one parameter of a fitting function; and
    determining at least one motor parameter based on the at least one parameter of the fitting function.

2. The method of claim 1 wherein analyzing the set of sampled data points with the fitting function includes:
    selecting at least one fitting window based on at least one phase voltage being switched on and off to the at least one motor winding, the at least one fitting window selected to exclude at least one transient component of the at least one phase current and including the subset of the sampled data points.

3. The method of claim 2 wherein the at least one fitting window is determined based on a pulse width modulation synchronization pulse.

4. The method of claim 3 wherein the at least one fitting window is further determined based on a switching state of the at least one motor winding.

5. The method of claim 2 comprising determining a phase current for sampled data points corresponding to the at least one transient component based on the fit.

6. The method of claim 1 wherein the fitting function is a linear function and the at least one parameter of the fitting function includes a slope and an offset of the linear function.

7. The method of claim 6 comprising determining the slope and offset of the linear function based on central tendencies respectively of phase current, time, the product of phase current and time, and the square of time, wherein the central tendencies are determined recursively.

8. The method of claim 7 comprising determining the slope and offset of the linear function based on a square of a mean value of time, a mean value of a square of time, a product of a mean value of time and a mean value of phase current, and mean value of a product of time and phase current.

9. The method of claim 1 wherein filtering the subset of sampled data points includes performing a least squares fit.

10. The method of claim 1 wherein the phase current is oversampled at a rate of at least two samples per pulse width modulation period.

11. The method of claim 1 wherein the at least one motor parameter includes an inductance.

12. The method of claim 1 wherein the at least one motor parameter includes a resistance.

13. The method of claim 1 wherein the at least one motor parameter includes a magnetization.

14. A motor control system for determining at least one motor parameter using an adaptive filter, the motor control system comprising:
- power circuitry configured to deliver a phase voltage to a motor winding, the phase voltage causing a phase current to flow in the motor winding;
- a current sensor configured to sense the phase current flowing in the motor winding;
- sampling circuitry configured to convert the sensed phase current into a set of sampled data points;
- an adaptive filter configured to filter a subset of the sampled data points to determine at least one parameter of a fitting function; and
- a motor controller configured to determine the at least one motor parameter based on the determined at least one parameter of the fitting function.

15. The system of claim 14 comprising pulse width modulation timing circuitry for controlling the timing of the phase current delivered to the motor winding, the pulse width modulation timing circuitry determining at least one fitting window, the at least one fitting window excluding at least one transient component and determining the subset of the sampled data points.

16. The system of claim 14 wherein the fitting function is a linear function.

17. The system of claim 16 wherein the at least one parameter of the fitting function includes a slope and an offset of the linear function.

18. The system of claim 17 wherein the adaptive filter is configured to determine the slope and offset of the linear function based on central tendencies respectively of phase current, time, the product of phase current and time, and the square of time, wherein the central tendencies are determined recursively.

19. The system of claim 14 wherein the at least one motor parameter includes at least one of an inductance, a resistance, a magnetization, or a flux linkage.

20. A motor control system for determining at least one motor parameter, the motor control system comprising:
- means for sampling at least one phase current being supplied to at least one motor winding to form a set of sampled data points;
- means for filtering a subset of the set of sampled data points to determine at least one parameter of a fitting function; and
- means for determining at least one motor parameter based on the determined at least one parameter of the fitting function.

21. The motor control system of claim 20, further comprising means for selecting at least one fitting window based on at least one phase voltage being switched on and off to the at least one motor winding, the at least one fitting window selected to exclude at least one transient component of the at least one phase current and including the subset of the sampled data points.

* * * * *